(12) United States Patent
Forbes

(10) Patent No.: US 6,569,715 B1
(45) Date of Patent: May 27, 2003

(54) LARGE GRAIN SINGLE CRYSTAL VERTICAL THIN FILM POLYSILICON MOSFETS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/471,279

(22) Filed: Dec. 23, 1999

Related U.S. Application Data

(62) Division of application No. 09/229,891, filed on Jan. 14, 1999, now Pat. No. 6,049,106.

(51) Int. Cl.⁷ .............................................. H01L 21/332
(52) U.S. Cl. ........................ 438/138; 438/135; 438/137; 438/197; 438/199; 438/206; 438/212; 438/268; 438/564
(58) Field of Search ................................ 438/135, 137, 438/138, 197, 199, 206, 212, 268, 564

(56) References Cited

U.S. PATENT DOCUMENTS

| | | | |
|---|---|---|---|
| 4,449,285 A | * 5/1984 | Janes et al. | 29/571 |
| 4,649,624 A | * 3/1987 | Reedy | 29/571 |
| 4,954,454 A | * 9/1990 | Kobushi et al. | 437/21 |
| 5,233,207 A | * 8/1993 | Anzai | 257/66 |
| 5,315,140 A | 5/1994 | Sugahara et al. | |
| 5,382,549 A | 1/1995 | Ohshima et al. | |
| 5,385,863 A | 1/1995 | Tatsumi et al. | |
| 5,491,107 A | 2/1996 | Turner et al. | |
| 5,773,358 A | 6/1998 | Wu et al. | |
| 5,792,700 A | 8/1998 | Turner et al. | |
| 5,847,406 A | 12/1998 | Dennison et al. | |
| 6,127,230 A | * 10/2000 | Tang et al. | 438/268 |
| 6,194,254 B1 | * 2/2001 | Takemura | 438/166 |
| 6,362,511 B1 | * 3/2002 | Mizushima et al. | 257/412 |

OTHER PUBLICATIONS

G.K. Giust et al., "Laser Recrystallization of Polycrystalline Silicon in Recessed Structures", Journal of Electronic Materials, vol. 26, No. 8, 1997, pp. L13–L16.

Do–Hyun Choi et al., "Electrical Properties of Ultralarge Grain Polycrystalline Silicon Film Produced by Excimer–Laser Recrystalliaztion Method", Jpn. J. Appl. Phys. vol. 34 (1995) pp. 459–463.

E. Srinivasan et al., "Large Crystallite polysilicon Deposited Using Pulsed–Gas PECVD at Temperatures Less Than 250° C", Mat. Res. Soc. Symp.. Proc. vol. 452, 1997, Materials Research Society, pp. 989–994.

Eun Gu Lee et al., A Study of the Morphology and Microstructure Of LPCVD Polysilicon, Journal of Materials Science 28 (1993) pp. 6279–6284.

* cited by examiner

Primary Examiner—Long Pham
Assistant Examiner—Wai-Sing Louie
(74) Attorney, Agent, or Firm—Dickstein Shapiro Morin & Oshinsky LLP

(57) ABSTRACT

A vertical thin film transistor formed in a single grain of polysilicon having few or no grain boundaries for use in memory, logic and display applications. The transistor is formed from a thin film of polysilicon having large columnar grains, in which source and drain regions have been formed. The large grain size and columnar grain orientation of the thin film are provided by recrystallizing a thin amorphous silicon film, or by specialized deposition of the thin film. Use of a thin film permits the transistor to be formed on an insulating substrate such as glass, quartz, or inexpensive silicon rather than a semiconductor chip, thereby significantly decreasing device cost.

107 Claims, 5 Drawing Sheets

LARGE GRAIN SINGLE CRYSTAL VERTICAL THIN FILM POLYSILICON MOSFETS

This application is a divisional of application Ser. No. 09/229,891 filed on Jan. 14, 1999 now U.S. Pat. No. 6,049,106, which is hereby incorporated herein in its entirety by reference.

FIELD OF THE INVENTION

The present invention relates generally to an improved thin film metal-oxide-semiconductor field effect transistor (MOSFET) structure, and in particular to an improved thin film MOSFET formed in a single grain of polysilicon, and to a process for its formation.

BACKGROUND OF THE INVENTION

As circuit density continues to increase, there is a corresponding drive to produce ever smaller field effect transistors (FETs). Field effect transistors have typically been formed by providing active areas within a bulk substrate material or within a complementary conductivity type well formed within a bulk substrate. A technique finding greater application in achieving reduced transistor size is to form FETs with thin films, commonly referred to as "thin film transistor" (TFT) technology.

In the fabrication of TFTs, a thin film of material (typically polysilicon) with a substantially constant thickness is provided on an insulating substrate instead of a semiconductor chip. Source and drain regions are formed by ion implantation or diffusion, and gate insulators and gates are also formed, thus providing a FET having active and channel regions formed entirely within a thin film as opposed to a bulk substrate. The use of insulating substrates such as silicon dioxide, glass, or quartz decreases the cost of the completed device while offering benefits such as reduced bulk capacitance and increased operating speed. Because of these and other advantages, TFTs are especially desirable for use in memory and logic applications, particularly SRAMs, and in liquid crystal displays.

It is desirable in TFTs to use a film that is as thin as possible so that the channel region provides maximized desired on/off characteristics for the transistors. This thinness adversely affects source/drain region conductance, however, because the diminished volume of material creates undesirable elevated $V_{cc}$ source/drain resistance. Another disadvantage of TFTs is poor electrical performance because of defects in the polysilicon film such as grain boundaries. The effects of grain boundary defects, which include unwanted energy levels in the forbidden band, alteration of etching properties, and changes in electrical properties such as the value of the source/drain current and threshold voltage, are magnified in TFTs because of their small size.

Grain size and grain boundary consistency has a significant effect on the electrical current flow characteristics of thin films. Current resistance occurs as electrons cross grain boundaries, especially boundaries perpendicular to the direction of current flow. The larger and more numerous the grain boundaries, the higher the resistance. Typical TFTs have multiple grain boundaries within them because the channel length of the devices is much larger than the film thickness, which is usually approximately the same as the grain size.

There is needed, therefore, a thin film MOSFET with a minimum of grain boundaries, such that the MOSFET is typically formed in a single grain of polysilicon. A simple method of fabricating a thin film MOSFET with a minimum of grain boundaries is also needed.

SUMMARY OF THE INVENTION

The present invention provides a vertical thin film MOSFET having improved electrical functioning due to the formation of the transistor in a single grain of polysilicon. Also provided is a method for its formation, in which the transistor is formed from a thin film of polysilicon having large columnar grains. The large grain size and columnar grain orientation of the thin film are provided by recrystallizing a thin amorphous silicon film, or by specialized deposition of the thin film. Ion implantation and annealing are then performed to form source and drain regions in the thin film, which is patterned to form individual thin film transistors. Because of the large grain size and columnar orientation, the FETs have no grain boundaries within them, thereby maximizing conductance and threshold voltage reliability.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as including silicon-on-insulator (SOI) or silicon-on-sapphire (SOS) technology, glass, quartz, silicon dioxide, other silicon-containing foundations, and other insulating structures. The term "recrystallization" as used herein refers to the nucleation and growth of new grains within a preexisting crystalline matrix that has been made amorphous, or to grain enlargement of preexisting grains. The following detailed description is, therefore, not to be taken in a limiting sense, and the scope of the present invention is defined by the appended claims.

Figure 1:
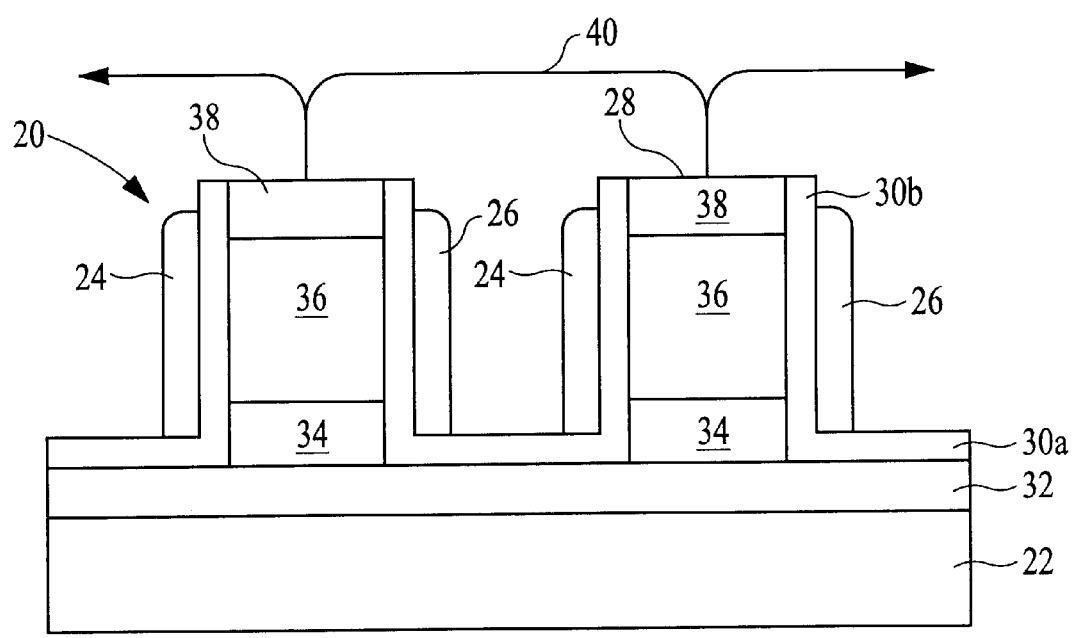
FIG. 1 is a cross-sectional view of the thin film transistor of the present invention.

Referring now to the drawings, where like elements are designated by like reference numerals, an embodiment of the thin film transistor 20 of the present invention is shown in FIG. 1. The thin film transistor 20 is formed vertically on a quartz substrate 22, and comprises two gates 24, 26 formed on either side of a vertical device stack 28. The gates 24, 26 may be formed of polysilicon, tungsten silicide, or other suitable conductive material, and have a width (horizontal thickness) within the range of 50 to 200 nm, preferably about 100 nm. A gate oxide region 30b approximately 100 Angstroms thick is formed between the gates 24, 26 and the device stack 28.

A local interconnect layer 32 of highly doped polysilicon is formed between the device stacks 28 and the substrate 22. For an n-channel thin film transistor 20, the local interconnect layer 32 is doped to a first conductivity level, e.g., n++. The vertical device stack 28 comprises a lower source region 34, a central channel or body region 36, and an upper drain region 38. For an exemplary transistor 20 of approximately 1 micron (10,000 Angstroms) in height, the source region 34 is approximately 1000 to 2000 Angstroms in height, the body or channel region 36 is approximately 6000 to 8000 Angstroms in height, and the drain region 38 is approximately 1000 to 2000 Angstroms in height. Preferably, for a 1 micron tall transistor, the source region 34 is approximately 1500 Angstroms in height, the body or channel region 36 is approximately 7000 Angstroms in height, and the drain region 38 is approximately 1500 Angstroms in height.

The source region 34 adjoins the local interconnect layer 32, and is made of polysilicon doped to a second conductivity level, e.g., n++. The channel or body region 36 is fabricated of single crystal silicon having a grain size of approximately 1 micron (10,000 Angstroms), so that a 1 micron tall transistor has its entire channel or body region 36 formed in a single grain of silicon. The drain region 38 overlies the upper surface of the channel or body region 36, and comprises polysilicon doped to a second conductivity level, e.g., n+ for an n-channel transistor. If a p-channel device were desired, the doping types and levels of these elements would be adjusted as is known in the art. Conventional wiring 40 connects the drain regions 38 of each thin film transistor 20 in a device array to other transistors in the array and to peripheral circuitry on the substrate 22.

The thin film transistor 20 is a MOSFET (metal-oxide-semiconductor FET) device having four contacts to other electrical cells or devices. First, the source 34 is in contact with the local interconnect layer 32, which connects the transistor 20 to other local devices. Second, the drain 38 of the transistor 20 is connected to conventional wiring 40 so that the transistor 20 is connected to other transistors and peripheral circuitry located on the substrate 22. The third and fourth contacts are made by a first gate 24 and a second gate 26, which are formed of conductive material such as doped polysilicon to gate the transistor 20 and to electrically connect all of the transistors of a given row in an array.

The thin film transistor 20 will typically be an enhancement-mode device, in which a voltage (the threshold voltage $V_T$) must be applied before the transistor will conduct. The exemplary n-channel transistor described herein operates when a positive gate voltage is applied, forming a depletion layer in the channel region 36 of the thin film transistor 20. When the voltage is increased to the threshold voltage $V_T$, the semiconductor becomes inverted at the surface and electrical current flows through the depletion layer between the source 34 and the drain 38. A p-channel transistor would operate similarly when a negative gate voltage is applied. Alternatively, the thin film transistor 20 may be a depletion-mode device, in which conduction takes place at a zero gate bias.

The large grain size (approximately 1 micron or 10,000 Angstroms) of the polysilicon material used to fabricate the thin film transistor 20 of the present invention enables the transistor to be formed in a single grain of silicon, thereby almost eliminating grain boundary defects. Even if a grain boundary is present in the transistor, the columnar orientation of the crystal grains results in a grain boundary that is parallel to electron flow in the transistor. Parallel grain boundaries do not directly impede current flow as perpendicular boundaries do.

The thin film transistor 20 is manufactured through a process described as following, and illustrated by FIGS. 2 through 11. For exemplary purposes, dimensions are suggested which are suitable for a transistor of 1 micron in height, and it should be understood that dimensions should be scaled accordingly for other transistor heights. First, a substrate 22, which may be any of the types of substrate described above, is selected as the base for the thin film transistor 20. For exemplary purposes, the substrate 22 will be described as a quartz substrate, and the following process should be modified as appropriate and as known in the art if a non-silicon-based substrate is used.

Figure 2:
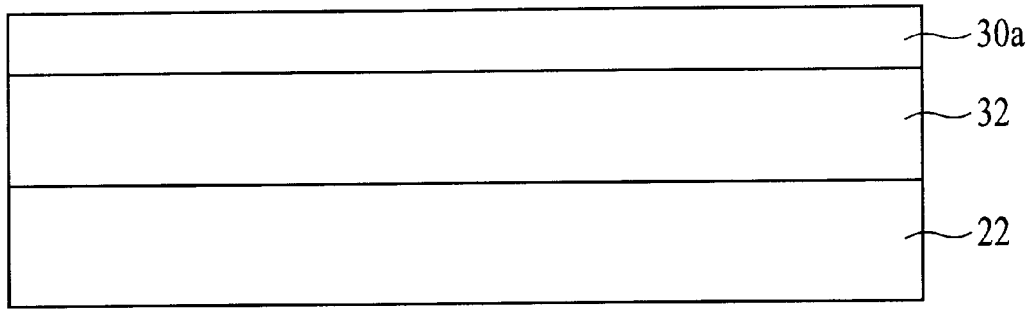
FIG. 2 is a cross-sectional view of a substrate undergoing the process of a preferred embodiment.

As shown in FIG. 2, the first step in the process is to form a local interconnect layer 32 of highly doped polysilicon on the substrate 22. This layer may be formed by means such as chemical vapor deposition (CVD), physical vapor deposition (PVD), or epitaxial growth, and the method used will be adjusted as is known in the art to compensate for the type of substrate 22 used. The local interconnect layer 32 is formed of polysilicon doped to a first conductivity level, e.g., n++ for an n-channel transistor, and p++ for a p-channel transistor, and should be approximately 1000 to 3000 Angstroms thick. Next, an oxide layer 30 is formed on the local interconnect layer 32 by thermal oxidation, CVD, or other suitable means. This oxide layer 30a should be approximately 500 to 5000 Angstroms in thickness.

Figure 3:
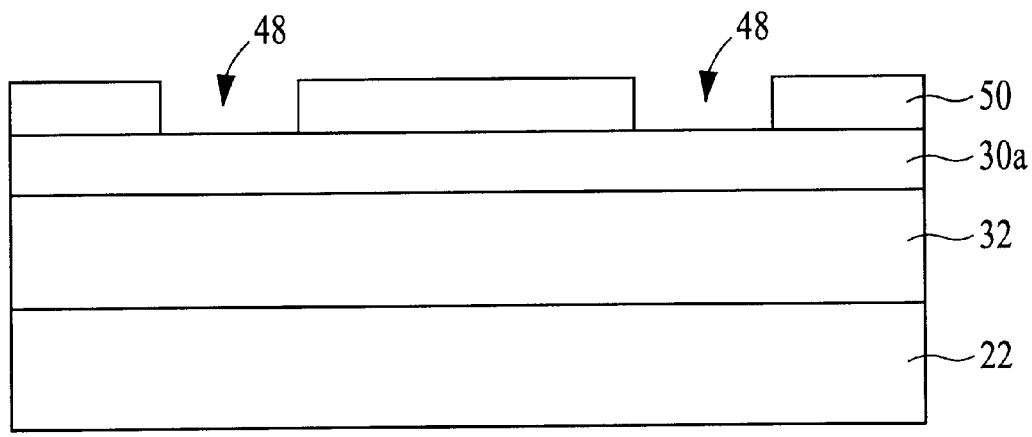
FIG. 3 shows the substrate of FIG. 2 at a processing step subsequent to that shown in FIG. 2.
Figure 4:
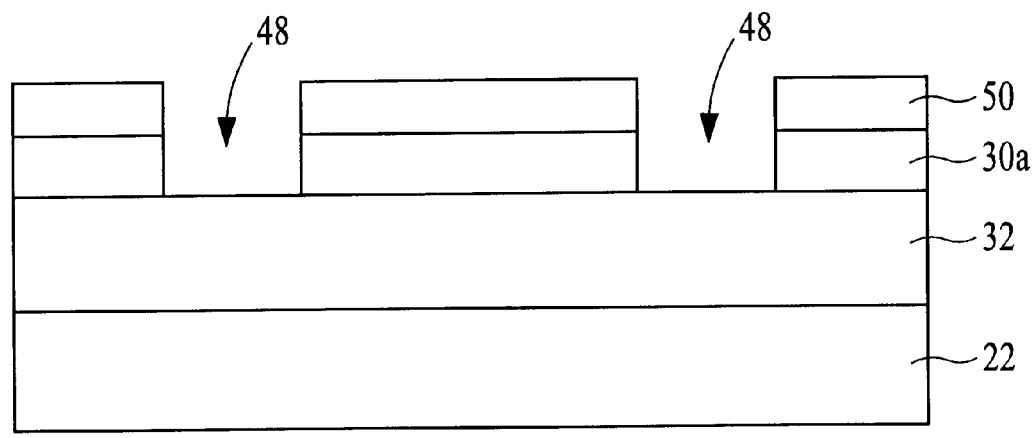
FIG. 4 shows the substrate of FIG. 2 at a processing step subsequent to that shown in FIG. 3.

A photoresist 50 and mask (not shown) are then applied over the oxide layer 30a, and photolithographic techniques are used to produce a patterned mask as depicted in FIG. 3, which is used for defining a trench on the oxide surface for each transistor to be formed. A directional etching process such as wet etching using an acid such as nitric and/or hydrofluoric acid, or dry etching methods such as plasma etching or reactive ion etching (RIE) is used to etch through the oxide layer 30a to expose the local interconnect layer 32, forming a set of trenches 48, as shown in FIG. 4. The photoresist and mask are then stripped.

Figure 5:
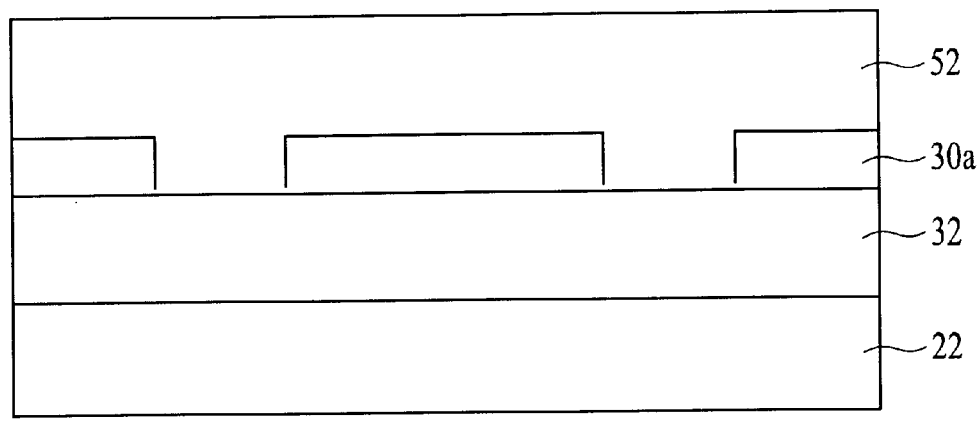
FIG. 5 shows the substrate of FIG. 2 at a processing step subsequent to that shown in FIG. 4.

FIG. 5 shows the next step in the process, in which a thin amorphous silicon film 52 is deposited on the oxide layer 30a and in the trenches 48. The amorphous silicon film 52 should be approximately 1 micron thick, and is formed by CVD at low temperatures, e.g., below 580 degrees Celsius, or by other suitable means.

Figure 6:
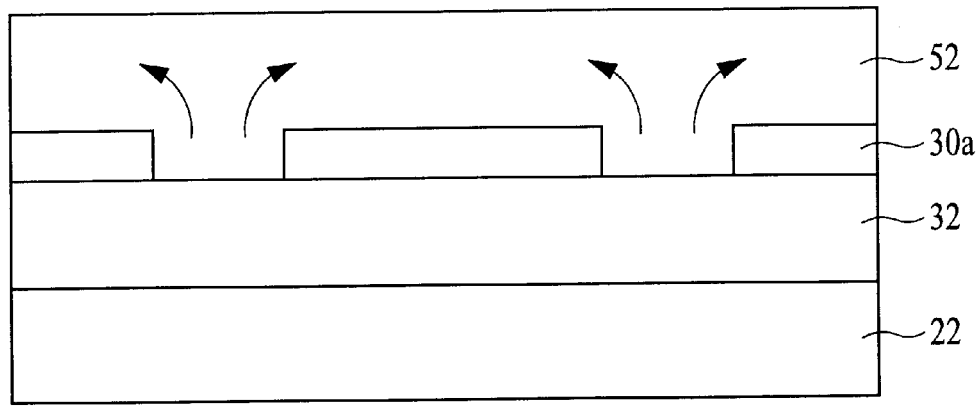
FIG. 6 shows the substrate of FIG. 2 at a processing step subsequent to that shown in FIG. 5.

Referring now to FIG. 6, the amorphous silicon film 52 is now transformed by a recrystallization process into a large grain silicon film 52. A preferred recrystallization method involves irradiation with a laser, such as an ArF or XeCl excimer laser, to accomplish crystal growth. Crystals grow preferentially out of the recessed areas of the amorphous silicon film 52 (the filled trenches 48) because the rate of cooling is faster in the trench 48 than over the oxide layer 30a outside the trench 48. The differential cooling rate is due to the trench 48 having a lower thermal resistance to the polysilicon below the oxide layer 30, creating lateral temperature gradients and lateral grain growth during the solidification process. The temperature gradient also causes the melt front to move outward from the trench 48, making a band several microns wide that consists primarily of columnar grains.

Alternatively, a large grain silicon film 52 may be formed by specialized CVD techniques, such as low pressure CVD, on the structure of FIG. 4. If the CVD pressure is low enough, the transition temperature of the silicon crystallization is lowered, and the surface silicon migration rate is enhanced. Careful manipulation of process parameters may be achieved such that the crystal growth rate greatly exceeds the deposition rate, resulting in columnar grain structure of the deposited polysilicon. Other methods of forming the large grain silicon film 52 on the structure of FIG. 4 include depositing the polysilicon film by vapor-phase growth on a pre-formed silicon nucleus, which results in a columnar crystalline orientation normal to the surface of the substrate. The particular method used to obtain the large grain size and columnar crystal orientation may be chosen depending on the electrical characteristics desired in the finished device, as is understood by those skilled in the art.

Figure 7:
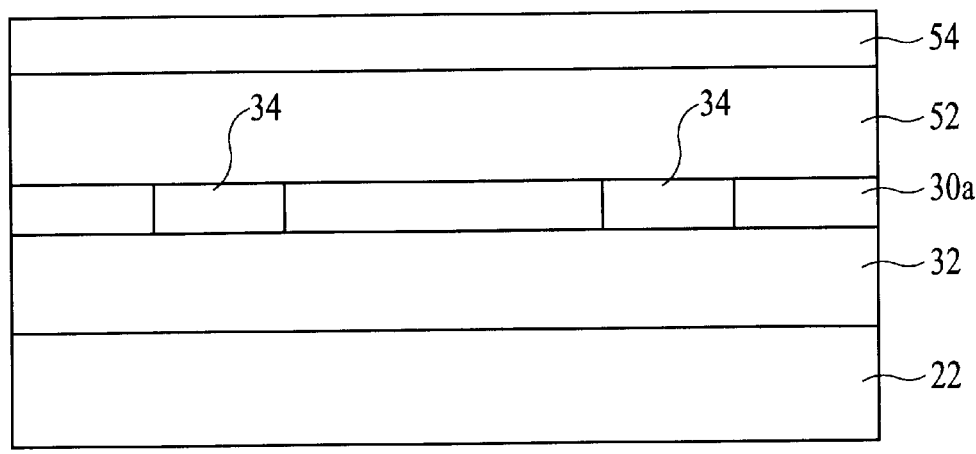
FIG. 7 shows the substrate of FIG. 2 at a processing step subsequent to that shown in FIG. 6.

As shown in FIG. 7, a doped polysilicon layer 54 is now formed in the large grain silicon film 52 by ion implantation. Dopant ions are ion implanted into the upper portion of the large grain silicon film 52 in a concentration sufficient to form a doped layer 54 of a second conductivity level, e.g., n+ for an n-channel device. An annealing step is then performed at approximately 900 degrees Celsius to redistribute and activate the implanted dopant. The anneal also causes dopant ions to outdiffuse from the local interconnect layer 32 into lower portions of the large grain silicon film 52, forming source regions 34 of a first conductivity level, e.g., n++ for an n-channel device.

Figure 8:
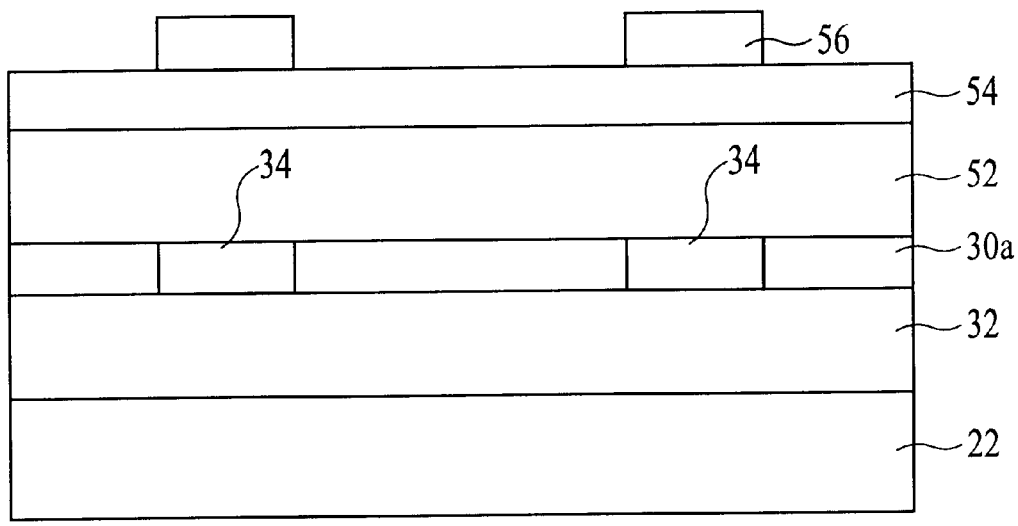
FIG. 8 shows the substrate of FIG. 2 at a processing step subsequent to that shown in FIG. 7.
Figure 9:
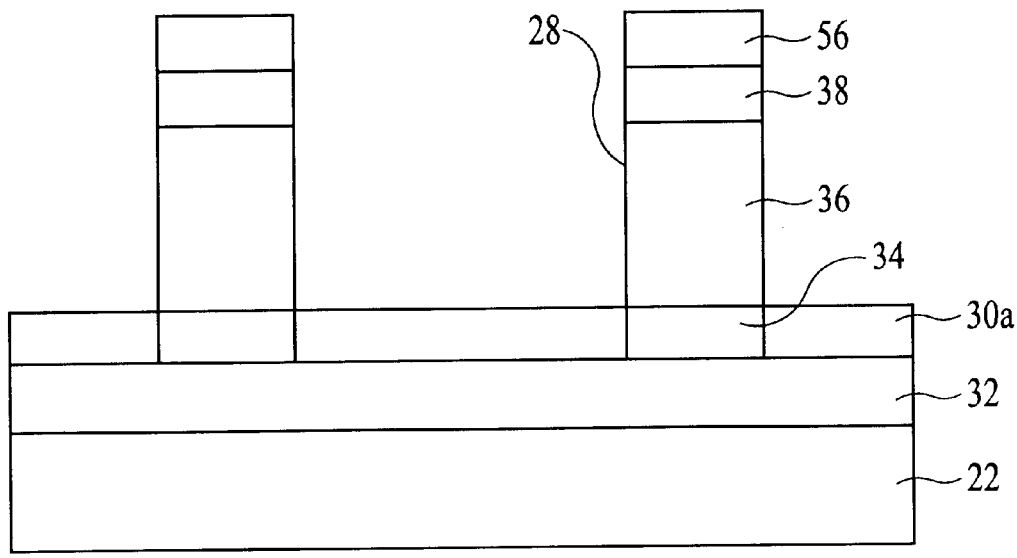
FIG. 9 shows the substrate of FIG. 2 at a processing step subsequent to that shown in FIG. 8.

Next, a photoresist 56 and mask (not shown) are then applied over the doped layer 54, as depicted by FIG. 8, and photolithographic techniques are used to define a device stack 28 from the large grain silicon film 52 for each transistor to be formed. A directional etching process such as wet etching using an acid such as nitric and/or hydrofluoric acid, or dry etching methods such as plasma etching or reactive ion etching (RIE) is used to etch through the large grain silicon film 52, yielding a device stack 28, as shown in FIG. 9. The device stack 28 comprises a source region 34 on the local interconnect layer 32, a channel or body region 36 on the source region 34, and a drain region 38 formed on the channel region 36 from the doped layer 54. The photoresist and mask are then stripped, removing layer 56 from the structure of FIG. 9.

Figure 10:
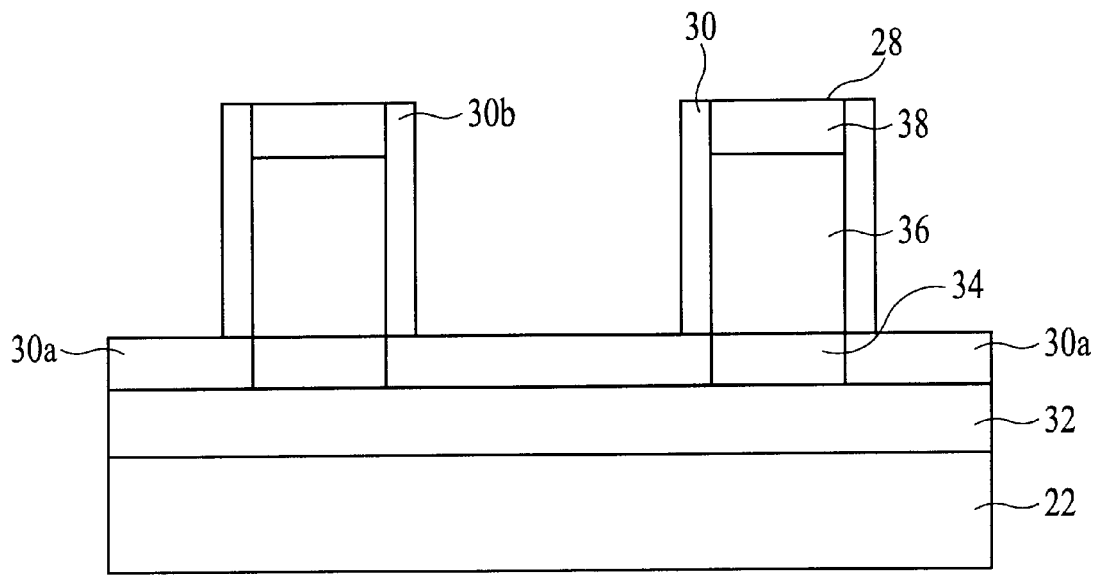
FIG. 10 shows the substrate of FIG. 2 at a processing step, subsequent to that shown in FIG. 9.

Thermal oxidation is then performed to create a gate oxide layer 30b on the sides of the device stacks 28, as shown in FIG. 10. The device stacks 28 are thermally oxidized by a suitable process known in the art, such as by heating the substrate 22 in a standard silicon processing furnace at a temperature of approximately 900 to 1100 degrees Celsius in a wet ambient.

Figure 11:
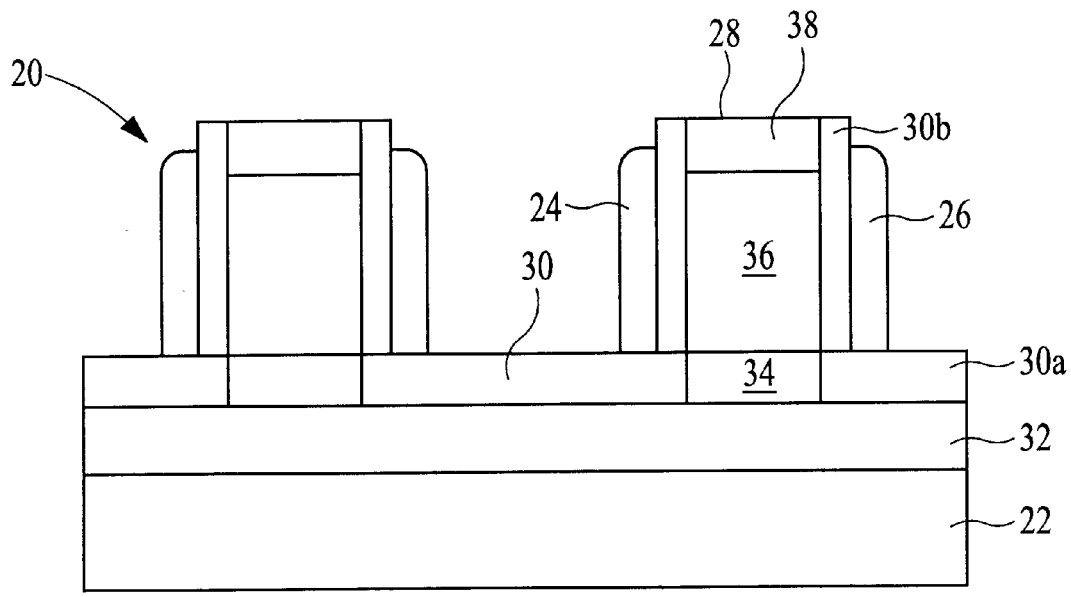
FIG. 11 shows the substrate of FIG. 2 at a processing step subsequent to that shown in FIG. 10.

FIG. 11 depicts the last step of the process of forming the thin film transistor, in which polysilicon or other conductive material is deposited by CVD or other suitable means on opposite sides of the device stacks 28 to form first and second gates 24, 26. Deposition of the polysilicon or other conductive material is followed by directional etching such as RIE to shape the gates 24, 26 and to remove any excess polysilicon or other conductive material from horizontal surfaces of the oxide layer 30a.

The thin film transistor 20 is essentially complete at this stage, and conventional processing methods may then be used to form contacts and wiring to connect gate lines and other connections. For example, the thin film transistor 20 may be covered with a passivation layer of, e.g., silicon dioxide, BSG, PSG, or BPSG, which is CMP planarized and etched to provide contact holes, which may then be metallized to provide contacts to the transistor gates and interconnect layer 32. Metallization layers and dielectric layers may be applied in conventional fashion to interconnect the individual transistors into a functioning circuit.

As can be seen by the embodiments described herein, the present invention encompasses thin film transistors formed in a single grain of polysilicon, thereby reducing the number of grain boundaries found in the device channel. As may be readily appreciated by persons skilled in the art, this lack of grain boundaries provides improved electrical functioning for the transistor.

The process sequence described and illustrated above provides for the formation of minimum dimension devices of one carrier type. It follows that, devices of either carrier type may be made on the same substrate by substitution of the appropriately doped materials and addition of appropriate masks. In addition, implanted source/drain devices may be fabricated on the same substrate by process integration with common process steps.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming a semiconductor device, comprising the steps of:
    forming a large grain silicon film over a substrate, said large grain silicon film comprising crystals having grain boundaries primarily normal relative to a surface of said substrate;
    forming a first doped layer in an upper portion of the large grain silicon film;
    annealing said large grain silicon film and said first doped layer to simultaneously activate said first doped layer and form a second doped layer in a lower portion of the large grain silicon film, wherein an undoped region exists between said first doped layer and said second doped layer of said large grain silicon film;
    patterning and removing portions of the large grain silicon film and the first and second doped layers to form a vertical device stack, wherein said undoped region is over said second doped layer and said first doped layer is over said undoped region;
    forming a gate oxide layer on at least one side of the device stack; and
    forming a first gate over said gate oxide layer on said at least one side of the device stack.

2. The method of claim 1, further comprising forming a second gate on a second side of the device stack.

3. The method of claim 1, wherein said large grain silicon film forming step comprises deposition of an amorphous silicon film on the substrate and recrystallization of the amorphous silicon film to form the large grain silicon film.

4. The method of claim 1, wherein said large grain silicon film forming step comprises low pressure chemical vapor deposition.

5. The method of claim 1, wherein said large grain silicon film forming step comprises forming a silicon nucleus on the substrate and depositing silicon by vapor-phase growth onto the silicon nucleus.

6. The method of claim 1, wherein said first doped layer forming step comprises ion implantation.

7. The method of claim 1, further comprising providing a doped polysilicon local interconnect layer on the substrate prior to said large grain silicon film forming step.

8. The method of claim 7, wherein said second doped layer forming step comprises outdiffusion of dopant from the doped polysilicon local interconnect layer into the lower portion of the large grain silicon film.

9. The method of claim 1, wherein said patterning step comprises wet etching of the large grain silicon film using a photolithographic template.

10. The method of claim 1, wherein said patterning step comprises dry etching of the large grain silicon film using a photolithographic template.

11. The method of claim 1, wherein said substrate providing step comprises providing a quartz substrate.

12. The method of claim 1, wherein said substrate providing step comprises providing a glass substrate.

13. The method of claim 1, wherein said substrate providing step comprises providing a silicon dioxide substrate.

14. The method of claim 1, wherein the large grain silicon film is approximately 10,000 Angstroms in height, the first doped layer is approximately 1000 to 2000 Angstroms in height, and the second doped layer is approximately 1000 to 2000 Angstroms in height.

15. The method of claim 1, wherein the large grain silicon film is approximately 10,000 Angstroms in height, the first doped layer is approximately 1500 Angstroms in height, and the second doped layer is approximately 1500 Angstroms in height.

16. A method of forming a semiconductor device, comprising the steps of:
  forming a patterned oxide layer over a substrate, wherein the patterned oxide layer has at least one trench therein that exposes the substrate, said at least one trench having a depth normal to a surface of said substrate;
  forming a large grain silicon film over the patterned oxide layer and within said at least one trench by vapor-phase growth on a pre-formed silicon nucleus, wherein crystals of said large grain silicon film grow within said at least one trench in a direction substantially parallel to said depth of said at least one trench;
  forming a first doped layer in an upper portion of the large grain silicon film;
  subsequent to forming said first doped layer, forming a second doped layer in a lower portion of the large grain silicon film adjacent the substrate and in the trench of the patterned oxide layer;
  patterning the large grain silicon film and the first and second doped layers to form a vertical device stack where said first doped layer is over said second doped layer;
  forming a gate oxide layer on at least one side of the device stack; and
  forming a first gate over said gate oxide layer on said at least one side of the device stack.

17. The method of claim 16, further comprising forming a second gate on a second side of the device stack.

18. The method of claim 17, wherein the first and second sides of the device stack are opposite sides of the device stack.

19. The method of claim 16, wherein said patterned oxide layer forming step comprises forming an oxide layer on the substrate and subsequently wet etching the oxide layer using a photolithographic template.

20. The method of claim 16, wherein said patterned oxide layer forming step comprises forming an oxide layer on the substrate and subsequently dry etching the oxide layer using a photolithographic template.

21. The method of claim 16, wherein said vapor-phase growth is preformed at a temperature below 580 degrees Celsius.

22. The method of claim 16, wherein said first doped layer forming step comprises ion implantation.

23. The method of claim 16, further comprising providing a doped polysilicon local interconnect layer on the substrate prior to said patterned oxide layer forming step.

24. The method of claim 23, wherein said second doped layer forming step comprises outdiffusion of dopant from the doped polysilicon local interconnect layer into the lower portion of the large grain silicon film.

25. The method of claim 16, wherein said gate oxide layer forming step comprises thermal oxidation.

26. The method of claim 16, wherein said substrate providing step comprises providing a quartz substrate.

27. The method of claim 16, wherein said substrate providing step comprises providing a glass substrate.

28. The method of claim 16, wherein said substrate providing step comprises providing a silicon dioxide substrate.

29. The method of claim 16, wherein the large grain silicon film is approximately 10,000 Angstroms in height, the first doped layer is approximately 1000 to 2000 Angstroms in height, and the second doped layer is approximately 1000 to 2000 Angstroms in height.

30. The method of claim 16, wherein the large grain silicon film is approximately 10,000 Angstroms in height, the first doped layer is approximately 1500 Angstroms in height, and the second doped layer is approximately 1500 Angstroms in height.

31. A method of forming a semiconductor device, comprising the steps of:
  providing a substrate with a doped polysilicon local interconnect layer formed thereon;
  forming a patterned oxide layer on the doped polysilicon local interconnect layer, wherein the patterned oxide layer has at least one trench therein that exposes the doped polysilicon local interconnect layer;
  forming an amorphous silicon film on the patterned oxide layer, within said at least one trench, and on said doped polysilicon local interconnect layer where exposed;
  recrystallizing the amorphous silicon film to form a large grain silicon film, wherein said at least one trench effects the direction of said recrystallizing such that silicon crystals of said silicon film grow primarily normal to said surface of said local interconnect layer within said at least one trench;
  implanting dopant ions in an upper portion of the large grain silicon film to form a first doped layer;

annealing to form a second doped layer in a lower portion of the large grain silicon film in the trench of the patterned oxide layer by outdiffusion from the doped polysilicon local interconnect layer, wherein a portion of said large grain silicon film between said doped polysilicon local interconnect layer and said first doped layer remains undoped;

patterning the large grain silicon film to form a device stack, wherein grain boundaries in said large grain silicon film are substantially parallel to a height of said device stack;

forming a gate oxide layer on at least two sides of the device stack; and forming a first gate over said gate oxide layer and a second gate over said gate oxide layer on a first and a second side, respectively, of the device stack.

32. The method of claim 31, wherein the doped polysilicon local interconnect layer is formed by chemical vapor deposition.

33. The method of claim 31, wherein the doped polysilicon local interconnect layer is formed by physical vapor deposition.

34. The method of claim 31, wherein the doped polysilicon local interconnect layer is formed by epitaxial growth.

35. The method of claim 31, wherein said patterned oxide layer forming step comprises forming an oxide layer on the doped polysilicon local interconnect layer and subsequently wet etching the oxide layer using a photolithographic template.

36. The method of claim 31, wherein said patterned oxide layer forming step comprises forming an oxide layer on the doped polysilicon local interconnect layer and subsequently dry etching the oxide layer using a photolithographic template.

37. The method of claim 31, wherein said amorphous silicon film forming step comprises chemical vapor deposition.

38. The method of claim 37, wherein said chemical vapor deposition step is performed at a temperature below 580 degrees Celsius.

39. The method of claim 31, wherein the laser irradiation step is performed using an ArF laser.

40. The method of claim 31, wherein the laser irradiation step is performed using a XeCl laser.

41. The method of claim 31, wherein said patterning step comprises wet etching of the large grain silicon film using a photolithographic template.

42. The method of claim 31, wherein said patterning step comprises dry etching of the large grain silicon film using a photolithographic template.

43. The method of claim 42, wherein the dry etching is plasma etching.

44. The method of claim 42, wherein the dry etching is reactive ion etching.

45. The method of claim 31, wherein said gate oxide layer forming step comprises thermal oxidation.

46. The method of claim 31, wherein the first and second sides of the device stack are opposite sides of the device stack.

47. The method of claim 31, wherein said substrate providing step comprises providing a quartz substrate.

48. The method of claim 31, wherein said substrate providing step comprises providing a glass substrate.

49. The method of claim 31, wherein said substrate providing step comprises providing a silicon dioxide substrate.

50. The method of claim 31, wherein the large grain silicon film is approximately 10,000 Angstroms in height, the first doped layer is approximately 1000 to 2000 Angstroms in height, and the second doped layer is approximately 1000 to 2000 Angstroms in height.

51. The method of claim 31, wherein the large grain silicon film is approximately 10,000 Angstroms in height, the first doped layer is approximately 1500 Angstroms in height, and the second doped layer is approximately 1500 Angstroms in height.

52. A method of forming a semiconductor device, comprising the steps of:

providing a substrate;

forming a large grain silicon film by growing silicon crystals over the substrate by creating a melt front in said large grain silicon film, wherein said growth of said silicon crystals occurs at least partially within a trench in an oxide layer over said substrate, and said melt front proceeds in a direction primarily out of said trench;

forming a first doped layer in an upper portion of the large grain silicon film;

subsequently forming a second doped layer in a lower portion of the large grain silicon film adjacent the substrate;

patterning the large grain silicon film and the first and second doped layers and removing portions thereof to form a vertical device stack, where said first doped layer is over said undoped layer and said second doped layer;

forming a gate oxide layer on at least one side of the device stack; and forming a first gate over said gate oxide layer on said at least one side of the device stack.

53. The method of claim 52, further comprising forming a second gate over said gate oxide layer on a second side of the device stack.

54. The method of claim 52, wherein said large grain silicon film has a grain size of approximately 1 micron.

55. The method of claim 52, wherein said first doped layer forming step comprises forming said first doped layer using ion implantation.

56. The method of claim 52, further comprising providing a doped polysilicon local interconnect layer on the substrate prior to said large grain silicon film forming step.

57. The method of claim 56, wherein said second doped layer forming step comprises outdiffusing dopant from the doped polysilicon local interconnect layer into the lower portion of the large grain silicon film.

58. The method of claim 52, wherein said patterning step comprises wet etching of the large grain silicon film using a photolithographic template.

59. The method of claim 52, wherein said patterning step comprises dry etching of the large grain silicon film using a photolithographic template.

60. The method of claim 52, wherein said substrate is quartz substrate.

61. The method of claim 52, wherein said substrate is a glass substrate.

62. The method of claim 52, wherein said substrate is a silicon dioxide substrate.

63. The method of claim 52, wherein the large grain silicon film is approximately 10,000 Angstroms in height, the first doped layer is approximately 1000 to 2000 Angstroms in height, and the second doped layer is approximately 1000 to 2000 Angstroms in height.

64. The method of claim 52, wherein the large grain silicon film is approximately 10,000 Angstroms in height, the first doped layer is approximately 1500 Angstroms in height, and the second doped layer is approximately 1500 Angstroms in height.

65. A method of forming a semiconductor device, comprising the steps of:
providing a substrate;
providing a doped region over said substrate;
forming a patterned oxide layer on the doped region, wherein the patterned oxide layer has at least one trench therein that exposes the doped region;
forming an amorphous silicon film over the patterned oxide layer, within said at least one trench and over said doped region where exposed;
recrystallizing the amorphous silicon film to form large grain silicon crystals, wherein the amorphous silicon film recrystallized by columnar growth of said silicon crystals, the direction of said growth being directed by said at least one trench to be primarily normal to a surface of said substrate;
implanting a dopant in said recrystallized silicon film to form a first doped layer in an upper portion of the recrystallized silicon film;
annealing said recrystallized silicon film to form a second doped layer in a lower portion of the recrystallized silicon film adjacent the doped region and in the trench of the patterned oxide layer;
patterning the recrystallized silicon film and the first and second doped layers to form a device stack where said first doped layer is over said second doped layer and said doped region;
forming a gate oxide layer on at least one side of the device stack; and
forming a first gate over said gate oxide layer on said at least one side of the device stack.

66. The method of claim 65, further comprising forming a second gate over said gate oxide layer on a second side of the device stack.

67. The method of claim 66, wherein the first and second sides of the device stack are opposite sides of the device stack.

68. The method of claim 65, wherein said patterned oxide layer forming step comprises forming an oxide layer on the substrate and subsequently wet etching the oxide layer using a photolithographic template.

69. The method of claim 65, wherein said patterned oxide layer forming step comprises forming an oxide layer on the substrate and subsequently dry etching the oxide layer using a photolithographic template.

70. The method of claim 65, wherein said amorphous silicon film forming step comprises forming said amorphous silicon film using chemical vapor deposition.

71. The method of claim 70, wherein said chemical vapor deposition step is performed at a temperature below 580 degrees Celsius.

72. The method of claim 65, wherein said recrystallizing step comprises irradiation of the amorphous silicon film with a laser.

73. The method of claim 72, wherein the laser is an ArF laser.

74. The method of claim 72, wherein the laser is a XeCl laser.

75. The method of claim 65, wherein said first doped layer forming step comprises forming said first doped layer using ion implantation.

76. The method of claim 65, where said doped region is part of a doped polysilicon local interconnect layer on the substrate formed prior to said patterned oxide layer forming step.

77. The method of claim 76, wherein said second doped layer forming step comprises outdiffusing dopant from the doped polysilicon local interconnect layer into the lower portion of the recrystallized silicon film.

78. The method of claim 65, wherein said gate oxide layer forming step comprises forming said gate oxide layer using thermal oxidation.

79. The method of claim 65, wherein said substrate is a quartz substrate.

80. The method of claim 65, wherein said substrate is a glass substrate.

81. The method of claim 65, wherein said substrate is a silicon dioxide substrate.

82. The method of claim 65, wherein the recrystallized silicon film is approximately 10,000 Angstroms in height, the first doped layer is approximately 1000 to 2000 Angstroms in height, and the second doped layer is approximately 1000 to 2000 Angstroms in height.

83. The method of claim 65, wherein the recrystallized silicon film is approximately 10,000 Angstroms in height, the first doped layer is approximately 1500 Angstroms in height, and the second doped layer is approximately 1500 Angstroms in height.

84. The method of claim 65, wherein said recrystallized silicon film has a grain size of approximately 1 micron.

85. A method of formning a semiconductor device, comprising the steps of:
providing a substrate with a doped polysilicon local interconnect layer formed thereon, said local interconnect layer having a surface parallel to said substrate;
forming a patterned oxide layer on the doped polysilicon local interconnect layer, wherein the patterned oxide layer has at least one trench therein that exposes the doped polysilicon local interconnect layer;
forming an amorphous silicon film on the patterned oxide layer, within said at least one trench, and over said doped polysilicon local interconnect layer where exposed;
recrystallizing the amorphous silicon film to form a recrystallized silicon film comprising large grain silicon crystals, wherein said large grain silicon crystals have grain boundaries primarily normal to said surface of said doped polysilicon local interconnect, said growth being at least partially directed by said at least one trench;
implanting dopant ions in an upper portion of the recrystallized silicon film to form a first doped layer and an undoped region in said recrystallized silicon film under said first doped layer;
annealing said recrystallized film to simultaneously activate said dopant ions of said first doped layer and to form a second doped layer in a lower portion of the recrystallized silicon film in the trench of the patterned oxide layer and below the undoped region by outdiffusion of ions from the doped polysilicon local interconnect layer, wherein said undoped region remains between said first and second doped regions;
patterning the recrystallized silicon film to form a device stack;
forming a gate oxide layer on at least one side of the device stack; and
forming a first gate over said gate oxide layer on said at least one side of the device stack.

86. The method of claim 85, further comprising forming a second gate over said gate oxide layer on a second side of the device stack.

87. The method of claim 85, wherein the doped polysilicon local interconnect layer is formed by chemical vapor deposition.

88. The method of claim 85, wherein the doped polysilicon local interconnect layer is formed by physical vapor deposition.

89. The method of claim 85, wherein the doped polysilicon local interconnect layer is formed by epitaxial growth.

90. The method of claim 85, wherein said patterned oxide layer forming step comprises forming an oxide layer on the doped polysilicon local interconnect layer and subsequently wet etching the oxide layer using a photolithographic template.

91. The method of claim 85, wherein said patterned oxide layer forming step comprises forming an oxide layer on the doped polysilicon local interconnect layer and subsequently dry etching the oxide layer using a photolithographic template.

92. The method of claim 85, wherein said amorphous silicon film forming step comprises forming said amorphous silicon film using chemical vapor deposition.

93. The method of claim 92, wherein said chemical vapor deposition step is performed at a temperature below 580 degrees Celsius.

94. The method of claim 85, wherein the recrystallization step is performed using an ArF laser.

95. The method of claim 85, wherein the recrystallization step is performed using a XeCl laser.

96. The method of claim 85, wherein said patterning step comprises wet etching of the recrystallized silicon film using a photolithographic template.

97. The method of claim 85, wherein said patterning step comprises dry etching of the recrystallized silicon film using a photolithographic template.

98. The method of claim 97, wherein the dry etching is plasma etching.

99. The method of claim 97, wherein the dry etching is reactive ion etching.

100. The method of claim 85, wherein said gate oxide layer forming step comprises forming said gate oxide layer using thermal oxidation.

101. The method of claim 86, wherein the first and second sides of the device stack are opposite sides of the device stack.

102. The method of claim 85, wherein said substrate is a quartz substrate.

103. The method of claim 85, wherein said substrate is a glass substrate.

104. The method of claim 85, wherein said substrate is a silicon dioxide substrate.

105. The method of claim 85, wherein the recrystallized silicon film is approximately 10,000 Angstroms in height, the first doped layer is approximately 1000 to 2000 Angstroms in height, and the second doped layer is approximately 1000 to 2000 Angstroms in height.

106. The method of claim 85, wherein the recrystallized silicon film is approximately 10,000 Angstroms in height, the first doped layer is approximately 1500 Angstroms in height, and the second doped layer is approximately 1500 Angstroms in height.

107. The method of claim 85, wherein said recrystallized silicon film has a grain size of approximately 1 micron.

* * * * *

UNITED STATES PATENT AND TRADEMARK OFFICE
CERTIFICATE OF CORRECTION

PATENT NO. : 6,569,715 B1
DATED : May 27, 2003
INVENTOR(S) : Leonard Forbes

It is certified that error appears in the above-identified patent and that said Letters Patent is hereby corrected as shown below:

Title page,
Item [56], References Cited, OTHER PUBLICATIONS,
"Do-Hyun Choi et al." reference, "Recrystalliaztion" should read -- Recrystallization --

Column 11,
Line 15, "recrystallized" should read -- recrystallizes --

Column 12,
Line 26, "formning" should read -- forming --

Signed and Sealed this

Second Day of March, 2004

JON W. DUDAS
*Acting Director of the United States Patent and Trademark Office*